United States Patent
Frahm et al.

(10) Patent No.: US 9,529,066 B2
(45) Date of Patent: Dec. 27, 2016

(54) SPATIALLY ENCODED PHASE-CONTRAST MRI

(75) Inventors: Jens Frahm, Goettingen (DE); Klaus-Dietmar Merboldt, Goettingen (DE); Martin Uecker, Albany, CA (US); Dirk Voit, Goettingen (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 625 days.

(21) Appl. No.: 14/112,541

(22) PCT Filed: Apr. 21, 2011

(86) PCT No.: PCT/EP2011/002054
§ 371 (c)(1),
(2), (4) Date: Oct. 17, 2013

(87) PCT Pub. No.: WO2012/143021
PCT Pub. Date: Oct. 26, 2012

(65) Prior Publication Data
US 2014/0043026 A1 Feb. 13, 2014

(51) Int. Cl.
*G01R 33/561* (2006.01)
*G01R 33/563* (2006.01)
(Continued)

(52) U.S. Cl.
CPC .......... *G01R 33/48* (2013.01); *G01R 33/4826* (2013.01); *G01R 33/286* (2013.01);
(Continued)

(58) Field of Classification Search
CPC ... G01R 33/286; G01R 33/4826; G01R 33/48; G01R 33/5613; G01R 33/56316; G01R 33/56325
See application file for complete search history.

(56) References Cited

U.S. PATENT DOCUMENTS

| 4,707,658 A | 11/1987 | Frahm et al. |
| 6,134,464 A | 10/2000 | Tan et al. |

(Continued)

FOREIGN PATENT DOCUMENTS

| CN | 1098893 A | 2/1995 |
| CN | 1212145 A | 3/1999 |

(Continued)

OTHER PUBLICATIONS

Bryant et al., "Measurement of Flow with NMR Imaging Using a Gradient Pulse and Phase Difference Technique", Journal of Computer Assisted Tomography, vol. 8, No. 4, pp. 588-593 (1984).

(Continued)

*Primary Examiner* — Gregory H Curran
(74) *Attorney, Agent, or Firm* — Caesar Rivise, PC

(57) ABSTRACT

A method of collecting magnetic resonance data for imaging an object with a predetermined spin density being arranged in a static magnetic field, comprises the steps subjecting said object to at least one radiofrequency pulse and magnetic field gradients for creating spatially encoded magnetic resonance signals, including at least two settings of spatially encoding phase-contrast gradients differently encoding the phase of said magnetic resonance signals in at least one field of view in a predetermined spatial dimension, acquiring at least two magnetic resonance signals, each with one of said at least two settings of different spatially encoding phase-contrast gradients, and determining at least one mean spin density position of said object along said spatial dimension by calculating the phase difference between said signals. Furthermore, a control device and a magnetic resonance imaging (MRI) device implementing the method are described.

31 Claims, 6 Drawing Sheets

(51) Int. Cl.
*G01R 33/28* (2006.01)
*G01R 33/48* (2006.01)

(52) U.S. Cl.
CPC .... *G01R 33/5613* (2013.01); *G01R 33/56316* (2013.01); *G01R 33/56325* (2013.01)

(56) References Cited

U.S. PATENT DOCUMENTS

| | | | |
|---|---|---|---|
| 6,239,599 | B1 | 5/2001 | Zhou et al. |
| 6,472,873 | B2 | 10/2002 | Yamazaki |
| 6,737,865 | B2 | 5/2004 | Asano et al. |
| 8,269,496 | B2 * | 9/2012 | Subramanian ......... G01R 33/60 324/310 |
| 9,014,782 | B2 | 4/2015 | Miyoshi |
| 2007/0016000 | A1 | 1/2007 | Prince et al. |

FOREIGN PATENT DOCUMENTS

| | | |
|---|---|---|
| CN | 1346623 A | 5/2002 |
| CN | 1439336 A | 9/2003 |
| EP | 0636342 A1 | 2/1995 |
| JP | 2007190362 A | 8/2007 |
| WO | 2006119475 A2 | 11/2006 |

OTHER PUBLICATIONS

Du, "Contrast-Enhanced MR Angiography Using Time Resolved Interleaved Projection Sampling with Three-Dimensional Cartesian Phase and Slice Encoding (TRIPPS)", Magnetic Resonance in Medicine, vol. 61, pp. 918-924 (2009).
Merboldt et al., "Spatially Encoded Phase-Contrast MRI—3D MRI Movies of 1D and 2D Structures at Millisecond Resolution", Magnetic Resonance in Medicine, vol. 66, pp. 950-956 (2011).
Moran, "A Flow Velocity Zeugmatographic Interlace for NMR Imaging in Humans", Magnetic Resonance Imaging, vol. 1, pp. 197-203 (1982).
Nayler et al., "Blood Flow Imaging by Cine Magnetic Resonance", Journal of Computer Assisted Tomography, vol. 10, No. 5, pp. 715-722 (1986).
Spottiswoode et al., "3D Myocardial Tissue Tracking with Slice Followed Cine DENSE MRI", Journal of Magnetic Resonance Imaging, vol. 27, pp. 1019-1027 (2008).
Uecker et al., "Image Reconstruction by Regularized Nonlinear Inversion—Joint Estimation of Coil Sensitivities and Image Content", Magnetic Resonance in Medicine, vol. 60, pp. 674-682 (2008).
Uecker et al., "Nonlinear Inverse Reconstruction for Real-Time MRI of the Human Hear Using Undersampled Radial FLASH", Magnetic Resonance in Medicine, vol. 63, pp. 1456-1462 (2010).
Uecker et al., "Real-time MRI at a resolution of 20 ms", NMR Biomed., vol. 23, pp. 986-994 (2010).
Van Dijk, "Direct Cardiac NMR Imaging of Heart Wall and Blood Flow Velocity", Journal of Computer Assisted Tomography, vol. 8, No. 3, pp. 429-436 (1984).
Zhang et al., "Magnetic Resonance Imaging in Real Time: Advances Using Radial Flash", Journal of Magnetic Resonance Imaging, vol. 31, pp. 101-109 (2010).
Zhang et al., "Real-time cardiovascular magnetic resonance at high temporal resolution: radial FLASH with nonlinear inverse reconstruction", Journal of Cardiovascular Magnet Resonance, vol. 12, No. 39, pp. 1-7 (2010).
International Search Report for PCT/EP2011/002054 dated Feb. 8, 2012.

* cited by examiner

A

B

A

B

SPATIALLY ENCODED PHASE-CONTRAST MRI

FIELD OF THE INVENTION

The present invention relates to a method of collecting magnetic resonance (MR) data, in particular for MR imaging of an object with a predetermined spatial spin density. Furthermore, the invention relates to a control device being adapted for collecting MR data, in particular for MR imaging (MRI) of an object, and to a MRI device, in particular being configured for implementing the above method. Applications of the invention cover the field of MRI, in particular medical MRI (e.g., three-dimensional (3D) or interventional imaging) or non-medical investigations in natural sciences (e. g., investigations of a workpiece or a dynamic process).

BACKGROUND OF THE INVENTION

For describing the background of the invention, particular reference is made to the following publications.
[1] Moran P R. A flow velocity zeugmatographic interlace for NMR imaging in humans. Magn. Reson. Imaging 1982; 1:197-203.
[2] Van Dijk P. Direct cardiac NMR imaging of heart wall and blood flow velocity. J. Comput. Assist. Tomogr. 1984; 8:429-436.
[3] Bryant D J, Payne J A, Firmin D N, Longmore D B. Measurement of flow with NMR imaging using a gradient pulse and phase difference technique. J. Comput. Assist. Tomogr. 1984; 8:588-593.
[4] Nayler G L, Firmin D N, Longmore D B. Blood flow imaging by cine MR imaging. J. Comput. Assist. Tomogr. 1986; 10:715-722.
[5] Zhang S, Block K T, Frahm J. MR imaging in real time Advances using radial FLASH. J. Magn. Reson. Imaging. 2010; 31:101-109.
[6] Uecker M, Hohage T, Block K T, Frahm J. Image reconstruction by regularized nonlinear inversion—Joint estimation of coil sensitivities and image content. Magn. Reson. Med. 2008; 60:674-682.
[7] Uecker M, Zhang S, Frahm J. Nonlinear inverse reconstruction for real-time MRI of the human heart using undersampled radial FLASH. Magn. Reson. Med. 2010; 63:1456-1462.
[8] Uecker M, Zhang S, Voit D, Karaus A, Merboldt K D, Frahm J. Real-time MRI at a resolution of 20 ms. NMR Biomed. 2010; 23:986-994. 358.
[9] Zhang S, Uecker M, Voit D, Merboldt K D, Frahm J. Real-time cardiovascular MR at high temporal resolution: Radial. FLASH with nonlinear inverse reconstruction. J. Cardiovasc. Magn. Reson. 2010; 12:39.

Since the conception of MRI in 1973, a major driving force of its further technical, scientific and clinical development is the quest for speed. Historically, it took more than a decade before the fast low-angle shot (FLASH) MRI technique (U.S. Pat. No. 4,707,658 A) reduced the acquisition times for a cross-sectional image to the order of one second and allowed for a continuous imaging due to the generation of a sufficiently strong steady-state MR signal. Nevertheless, the monitoring of dynamic processes in real time remained hampered in particular due to the need for still relatively long measuring times of several hundreds of milliseconds for images with a reasonable spatial resolution. High-speed acquisition techniques have been developed for real-time MRI which suffer from a number of specific drawbacks. For example, so-called single-shot gradient-echo sequences such as echo-planar imaging and spiral imaging are prone to geometric distortions or even local signal losses that are caused by their inherent sensitivity to off-resonance effects, tissue susceptibility differences, and magnetic field inhomogeneities, which are unavoidable in many parts of the body. Complementary, single-shot MRI sequences that employ radiofrequency-refocused spin echoes or stimulated echoes and therefore are free from such problems, lead to a pronounced radiofrequency (RF) power absorption with the risk of local tissue heating or suffer from a compromised signal-to-noise ratio, respectively.

An essential improvement for MRI in real time has been obtained with a combination of FLASH sequences with radial data sampling and view sharing of successive raw data acquisitions (see S. Zhang et al. [5]). The radial data sampling allows for a moderate undersampling factor (about 2) and results in an image raw data acquisition of about 250 ms per frame. With a reconstruction of image updates using current image raw data that corresponds to only a part of a frame together with preceding image raw data (i.e., a so-called 'sliding window' method), even a temporal resolution of about 50 ms can be obtained resulting in a video frame rate of 20 MR images per second. However, with the method of S. Zhang et al. [5], disadvantages with regard to the image quality may result from the fact that the total acquisition time per image remains unchanged, that is as long as 250 ms. A further improvement of the imaging process has been obtained by an application of a nonlinear inverse reconstruction method to even more strongly undersampled image raw data of a radial FLASH acquisition (see [6] to [9]).

Furthermore, velocity-encoded phase-contrast MRI is a well established method for dynamically mapping flow velocities which has been developed during the early stages of MRI, e.g. see [1] to [4]. In its most common form velocity-encoded phase-contrast MRI is based on the phase difference between two cross-sectional images acquired with different bipolar velocity-encoding gradients. These velocity-encoding gradients are characterized by a self-compensating waveform and a resulting zero-order gradient moment=0 that leaves stationary spins unaffected but causes a phase for flowing spins corresponding to a first-order gradient moment>0. The zero-order gradient moment is the time integral of the gradient, while the first-order gradient moment is the time integral of the gradient multiplied with the time. For spins that are flowing with a constant velocity, the net phase difference is directly proportional to the velocity. The results of a velocity-encoded phase-contrast MRI measurement may be represented in a 3D dataset which comprises two spatial dimensions and one velocity (phase difference) dimension, so that each image pixel presents with a unique velocity value.

OBJECTIVE OF THE INVENTION

The objective of the invention is to provide an improved method of collecting MR data, in particular for MRI of an object with a predetermined spin density, e. g. for medical imaging purposes, which is capable of avoiding disadvantages of conventional techniques. In particular, the objective is to provide a method of collecting MR data for 3D MRI of an object with a very much (e.g., 100-fold) reduced acquisition time which further enables a continuous acquisition of 3D MR images with reduced acquisition times, thus allowing the provision of an image sequence with a practical frame rate, in particular without a loss in image quality. Furthermore, the objective of the invention is to provide an improved control device being adapted for collecting MR data, in particular for 3D MRI of an object with reduced acquisition time and to a MRI device, in particular being adapted for conducting the method of collecting MR data and imaging of the object.

SUMMARY OF THE INVENTION

The above objectives are solved by an MR data collecting method, a control device for collecting MR data and/or a device for MRI of an object comprising the features of the invention.

According to a first aspect of the invention, a method of collecting MR data, in particular for imaging of an object with a predetermined spin density being arranged in a static magnetic field is provided, which comprises the steps of subjecting the object to at least one RF pulse and magnetic field gradients for creating spatially encoded MR signals, acquiring the MR signals and determining at least one mean spin density position of said object. According to the invention, the object is subjected to the magnetic field gradients with at least two settings of spatially encoding phase-contrast gradients differently encoding the phase of said MR signals in at least one field of view (FOV) in a predetermined (selected) spatial dimension, and at least one pair of MR signals is acquired. Each signal of said pair of MR signals is acquired with one of said two settings of different spatially encoding phase-contrast gradients, respectively. Furthermore, according to the invention, the phase difference between said two MR signals of each pair of MR signals is calculated resulting in the at least one mean spin density position of said object along said spatial dimension.

According to a second aspect of the invention, a control device being adapted for collecting MR data, in particular for imaging of an object with a predetermined spin density, in particular with a method according to the above first aspect, comprises a RF pulse and gradient control device being adapted for subjecting said object to RF pulses and magnetic field gradients for creating spatially encoded MR signals, including a phase-contrast gradient setting device being adapted for at least two settings of spatially encoding phase-contrast gradients differently encoding the phase of said MR signals in at least one FOV in a predetermined spatial dimension, a signal acquisition device being adapted for acquiring at least two MR signals, each with one of said at least two settings of different spatially encoding phase-contrast gradients, and a calculation device being adapted for determining at least one mean spin density position of said object along said spatial dimension by calculating the phase difference between said MR signals.

According to a third aspect of the invention, a computer program residing on a computer-readable medium is provided, with a program code for carrying out the method according to the above first aspect.

According to a fourth aspect of the invention, an MRI device is provided which includes the control device according to the above second aspect.

The invention is most easily understood by comparing its idea to the principles underlying velocity-encoded phase-contrast MRI. Typically, velocity-encoded phase-contrast MRI acquires two cross-sectional two-dimensional (2D) images with different encodings of the MR phase in such a ways as to add information about the velocity of moving or flowing spin densities. The analysis comprises the calculation of the two 2D images, the determination of the respective 2D phase-difference map, and the visualization of the phase difference (which is proportional to the velocity in each image pixel) in a third dimension of a 3D image. In contrast, the invention may be referred to as spatially encoded phase-contrast MRI. Deviating from the aforementioned example, the method according to a first embodiment of the invention encodes spatial (rather than velocity) information along a third dimension (by acquiring only two differently encoded 2D images), so that the resulting 3D representation comprises three spatial dimensions. Application of this principle with objects extending along one main direction or to object spots even allows a further reduction of signals to be acquired. The general difference to velocity-encoded phase-contrast MRI is the specific nature of the phase-contrast gradients which for velocity encoding have a bipolar self-compensating waveform with a resulting zero-order gradient moment=0 that does not affect stationary spins, whereas spatially encoded phase-contrast MRI according to the teaching of the invention employs at least one spatially encoding phase-contrast gradient with a resulting zero-order gradient moment>0 that encodes a mean spin density position of the object along the selected spatial dimension. A second difference of the invention in comparison to velocity-encoded phase-contrast MRI as described above is the acquisition of a 2D projection image rather than a 2D cross-sectional image.

Thus, the inventors have found that the 3D MR data collection can be essentially facilitated and considerably accelerated, if the object is not imaged with conventional spatial resolution along the at least one selected spatial dimension, but rather the mean spin density position of the object along said spatial dimension is calculated. Instead of the typical 256 2D acquisitions (i.e., 256×256 repetition intervals) needed for conventional 3D MRI, the teaching according to the invention requires no more than only two 2D acquisitions which reduces the total acquisition time by more than a factor of 100. Although there is an apparent loss of information with respect to object features along the selected spatial dimension, it has been found that this apparent loss of information can be tolerated for a wide variety of objects and/or imaging tasks. As an example, if the object has a negligible extension along the selected spatial dimension compared with the remaining dimensions, e.g. if the object has the shape of a layer, line or dot, the calculation of the mean spin density position is sufficient for characterizing the location of an object voxel in space. As a further example, if the object's spin density has a pre-known geometric extension along the selected spatial dimension, the calculation of the mean spin density position is sufficient for characterizing the object in space as well. Even in the general case, that no information is available about the object shape and the intensity data representing the mean quantity of the object spin along the selected spatial dimension is collected only, the inventive MR data collection delivers useful projection data along the selected spatial dimension.

The term "mean spin density position" refers to the location of the spin density of the object at the selected spatial dimension as determined by the acquired phase of the complex averaged signal of said object along the selected spatial dimension in the presence of a spatial phase-contrast gradient with non-vanishing zero-order gradient moment. According to the invention, the location of the mean spin density position in the FOV along the selected spatial dimension is obtained, e.g. relative to the origin of an axis defining the selected spatial dimension. In other words, for collecting the MR data, at least one spatial dimension (phase-difference dimension, direction in space, spatial axis) is selected among three spatial dimensions spanning the object space, and for each object voxel, one location data representing the mean position of the object along the selected spatial dimension and one intensity data representing the mean quantity of the object spin density along the selected spatial dimension are collected.

The FOV is spanned by the phase difference of the pairwise applied phase-contrast gradients (e.g., from $-\pi$ to $\pi$ or from 0 to $2\pi$), and further depends on the zero-order gradient moment of the phase-contrast gradient(s). Thus, for improving the precision of determining the mean spin density location, the phase-contrast gradients preferably are applied along a spatial dimension where the object has a minimum extension, that is where the object extension is smaller than along other dimensions. Furthermore, said settings of different spatially encoding phase-contrast gradients preferably are oriented along a predetermined axis of said object having at most one closed spin density. Thus, the location of the only mean spin density is obtained.

Depending on the application of the invention, the information about the mean spin density position can be sufficient for characterizing the location of an object, in particular if further information on the object shape is know. If a complete image of the object is to be obtained, a conventional MR data collection is implemented along one or both of the two other spatial dimensions spanning the object space, or the inventive method of spatial phase-contrast encoding can be implemented in all three dimensions. Thus, with preferred examples, the invention allows for mapping curved 2D structures in 3D space by only two images with different spatial phase-encoding gradients that together define the FOV in the phase-difference dimension, while 3D maps of curved linear structures may be obtained from only three acquisitions of a single frequency-encoded line with two perpendicular phase encodings, that is within a total measuring time of only three repetition intervals which may be as short as 1 to 2 ms. Thus, 3D MRI of a linear or 1D object according to preferred embodiments of the invention requires no more than only three 1D acquisitions which reduces the total acquisition time by more than a factor of 10,000 in comparison to conventional 3D MRI which typically relies on 256×256 repetitive acquisitions.

According to the invention, applying the magnetic field gradients includes the step of providing at least two settings of spatially encoding phase-contrast gradients. The term "at least two settings of spatially encoding phase-contrast gradients" means that the phase-contrast setting device, in particular the currents driving the magnetic field gradient coils, are adjusted such that at least two different gradient field conditions are provided for collecting the MR data. One of said gradient field conditions can be characterized by an absence of the phase-contrast gradient (zero gradient). Thus, according to preferred embodiments of the invention, the settings of two different spatially encoding phase-contrast gradients along said FOV in said predetermined spatial dimension comprise settings of a zero gradient having a strength $G=0$ and a monopolar gradient having a strength $G>0$, or settings of two monopolar gradients having a strength $G>0$ and opposite polarity, or settings of two monopolar gradients having strengths $G_1>0$, $G_2>0$ and $G_1 \neq G_2$. In contrast to velocity-encoded phase-contrast MRI using self-compensating bipolar gradients, which have a zero-order gradient moment of zero and a first-order gradient moment>0, spatially encoding phase-contrast gradients with a strength $G>0$ are not self-compensating but ensure a zero-order gradient moment>0 that affects stationary spins. In fact, a further preferred embodiment of the invention employs spatially encoding phase-contrast gradients with an asymmetric bipolar gradient waveform having a zero-order gradient moment>0 for spatially encoding stationary spins and a first-order gradient moment=0, which eliminates the velocity-dependency of the phase for spins moving with constant velocity in the selected direction of the phase-contrast gradient. With this embodiment, inaccurate phase data can be minimized which could occur in imaging of rapidly moving objects. The principle of this embodiment is related to the design of conventional phase encoding gradients with flow compensation.

According to a first embodiment of the invention, an object to be imaged has its spin density distributed along an object layer. The term "object layer" refers to an object having a plane or curved surface shape (2D structure) with a negligible or a finite extension (thickness) in direction(s) perpendicular to the plane or curved surface. The object layer may have a constant thickness or a thickness distribution, and/or a homogeneous or inhomogeneous spin density distribution. Furthermore, the object layer may have a closed shape or a shape including empty regions (holes) and/or a plurality of layer sections separated from each other. As examples, in medical imaging, a flat body part, organ or biological tissue extending along a curved surface or a flat medical instrument, or in non-medical imaging, a flat workpiece, provide object layers.

With the first embodiment of the invention, a predetermined projection plane is selected, and the predetermined spatial dimension is oriented perpendicular to the projection plane. Preferably, the projection plane is selected such that the average extension (thickness) of the object layer perpendicular to the projection plane is minimized. The MR signal acquisition step, using the signal acquisition device, includes acquiring two 2D MR images representing projections of the object onto the projection plane in object space with said different settings of spatially encoding phase-contrast gradients along the spatial dimension perpendicular to said projection plane. A plurality of said mean spin density positions of said object along said spatial dimension are calculated for a plurality of different locations of the object layer covering the projection plane, thus resulting in the determination (reconstruction) of a 3D image of the object. As a main advantage of the first embodiment, when mapping curved 2D structures or surface layers in 3D space, the inventive method reduces the dimension of the necessary MRI acquisition process from three to two, which accelerates the acquisition by two orders of magnitude in comparison to conventional 3D MRI.

Preferably, the RF pulse and gradient control device is configured such that one of said at least two spatially encoding phase-contrast gradients is applied in a first repetition interval comprising a said sequence of RF and gradient pulses with the other of said two gradients being applied in the immediately following repetition interval, or one of said at least two spatially encoding phase-contrast gradients is applied in all repetition intervals associated to a first image acquisition with the other gradient being applied in all repetition intervals associated to a second image acquisition. According to the first alternative, the different spatially encoding phase-contrast gradients can be consecutively set in immediately successive repetitions of said RF pulses and magnetic field gradients. With this variant of the first embodiment, advantages can be obtained for MRI of objects moving with high velocity. Alternatively, the different spatially encoding phase-contrast gradients can be consecutively set in successive image acquisitions with said RF pulses and magnetic field gradients. This variant may have advantages in terms of a twofold higher frame rate when applying a sliding window technique to the calculation of phase-contrast maps that are shifted by only one image acquisition.

Another important advantage of the first embodiment of the invention results from the fact that any available imaging technique, in particular data collection and image reconstruction procedures can be used for acquiring the two 2D MR images. Thus, according to preferred variants of the invention, the RF pulses and magnetic field gradients can be adapted for Cartesian frequency- and phase-encoding, radial encoding, spiral encoding or other non-Cartesian encoding. Furthermore, the RF pulses and magnetic field gradients may be controlled such that, for example, a low-flip angle gradient-echo MRI sequence, a spin-echo MRI sequence, a stimulated echo MRI sequence, or an echo-planar imaging sequence is provided. According to a particularly preferred embodiment of the invention, the low-flip angle gradient-echo MRI sequence comprises an undersampled radial FLASH sequence. Thus, the image acquisition speed can be even more increased.

Although a preferred application of the invention involves a radial FLASH sequence, the inventive principle of spatial phase-contrast MRI may be combined with other MRI sequences. Also FLASH acquisitions may vary and deliver different contrasts or signal strengths depending on the echo time, flip angle and repetition time or the use of RF spoiling, refocusing gradients, fully balanced gradients or other preceding or interleaved RF pulses and/or magnetic field gradients. Examples for the latter applications comprise spatial pre-saturation or chemical shift selection which in the case of non-selective spatial excitation is simply accomplished by direct frequency-selective RF excitation of water or fat protons or any other desirable frequency range. In fact, spatial phase-contrast MRI of mobile line or layer structures may be applied to the surfaces of arbitrary materials regardless of whether they contain MRI-detectable protons or not. In either case, an advantageous solution would be to add a "surface contrast" which may be constructed as a flexible layer of mobile protons—if necessary—with a resonance frequency different from water and fat. Suitable aqueous solutions with a lanthanide shift reagent are well-known in NMR spectroscopy and generally available. Alternatively, one may also take advantage of non-proton nuclei as, for example, 19-fluorine, in which case the surface contrast may be delivered by perfluorocarbon compounds that are safely used as oxygen carriers in artificial blood substitutes. Another application of spatial phase-contrast MRI will be in interventional MRI, where high-speed 3D visualization of a biopsy needle suitably marked for MR visibility, catheter or other surgical instrument (being a linear object) may be accomplished within a few milliseconds (see below) preferably interleaved with real-time anatomical MRI [8,9].

According to a second embodiment of the invention, an object to be imaged has its spin density distributed along an object line, or has a spin density concentrated in at least one object spot having a predetermined extension. The term "object line" refers to an object having a plane or curved line shape (1D structure, linear structure) with a negligible or a finite extension (thickness) in direction(s) perpendicular to the plane or curved line. The object line may have a constant thickness or a thickness distribution, and/or a homogeneous or inhomogeneous spin density distribution. Furthermore, the object line may have a continuous shape along its length or a shape including empty regions (spaces) and/or a plurality of line sections separated from each other. In particular, the object line may comprise a plurality of object spots. As examples, in medical imaging, a vessel or extended organ or biological tissue or a medical device suitably marked for MR visibility, like a biopsy needle extending along a curved line, or in non-medical imaging, a tube-shaped work-piece, provide object lines. The term "object spot" refers to an object (dot, point source) having a finite extension (diameter) in all spatial directions, wherein the extension is negligible compared with a dimension of a FOV under investigation including the object spot. The object spot may have a spherical or a non-spherical shape, and/or a homogeneous or inhomogeneous spin density distribution. As examples, in medical imaging, an MR contrast agent dot concentrated in an organ or biological tissue or located on a medical device, or in non-medical imaging, a dot-shaped work-piece, provide object spots.

With the second embodiment of the invention, the object is subjected to magnetic field gradients including one frequency-encoding gradient. The frequency-encoding gradient is oriented along a projection axis (reference axis). Preferably, the projection axis is selected such that the average perpendicular distance between the object line or object spot(s) and the projection axis is minimized. The step of subjecting the object to RF pulses and magnetic field gradients includes at least three different settings of spatially encoding phase-contrast gradients along two FOVs in two predetermined different spatial dimensions perpendicular to the direction of said frequency-encoding gradient, i.e. perpendicular to the projection axis. The MR signal acquisition step includes acquiring at least three frequency-encoded MR signals, each after application of one of said different settings of spatially encoding phase-contrast gradients. One of the frequency-encoded MR signals delivers reference data, while the other two of the frequency-encoded MR signals are obtained with different phase settings. Thus, for each location along the projection axis, two mean spin density locations are obtained along the two different spatial dimensions, so that the complete spatial information about the object is obtained, and a 3D image of the object is determined (reconstructed). Advantageously, for 3D studies of linear structures the measuring time is further reduced from typically 256×256 repetition intervals to only 3 repetition intervals, that is by a factor of at least 10,000 or four orders of magnitude.

Preferably, with the second embodiment of the invention, the settings of the at least three different spatially encoding phase-contrast gradients comprise a setting of one zero gradient having a strength G=0 (providing the reference data), and settings of two gradients having strengths G>0 and being created along said two FOVs in said two predetermined spatial dimensions.

With an alternative variant of the second embodiment of the invention, the step of subjecting the object to RF pulses and magnetic field gradients includes two different settings of spatially encoding phase-contrast gradients along one FOV in one predetermined spatial dimension perpendicular to the direction of said frequency-encoding gradient. In this case, two frequency-encoded MR signals are acquired, each after application of one of said different settings of spatially encoding phase-contrast gradients, and a 2D image of the object is determined (reconstructed). This variant of the second embodiment of the invention may have advantages for MRI of 1D objects or spots arranged in a common plane.

A third embodiment of the invention is adapted for an object which has a spin density concentrated in an object spot having a predetermined extension. With this embodiment, it is sufficient to acquire four MR signals in the absence of a frequency-encoding gradient, wherein the settings of different spatially encoding phase-contrast gradients comprise one zero gradient having a strength G=0 which provides reference data and three gradients having strengths G>0 which are created along said three FOVs along spatial dimensions perpendicular to each other.

At least one of the following further features preferably can be implemented with the invention, in particular with one of the first to third embodiments. Advantageously, the at least one RF pulse can include at least one of a spatially non-selective, a frequency-selective, or a spatially selective RF pulse.

Furthermore, the step of determining at least one mean spin density position of said object can include a step of estimating a thickness of the object in the at least one FOV defined by the settings of different spatially encoding phase-contrast gradients from the strength of said MR signals. In particular, the amplitude of the two MR signals of each pair of MR signals is a measure of the object thickness along the selected spatial dimension which may additionally be affected by the chosen MRI sequence and acquisition parameters.

According to a particularly preferred application of the invention, in particular for imaging purposes, the inventive MR data collection is repeated a plurality of times and a plurality of successive images is reconstructed so that an image sequence is obtained. According to preferred embodiments of the invention, a repetition rate is selected, so that a moving object is imaged with temporal resolution of better than 50 ms, in particular better than 30 ms or even better than 10 ms, like 5 ms or below. In particular, if combined with undersampled radial FLASH and image reconstruction by regularized nonlinear inversion, spatial phase-contrast MRI allows for 3D mapping of dynamic surface structures in real time. First examples obtained by the inventors include 3D MRI movies of the acting human hand at a temporal resolution of 50 ms. Moreover, 3D MRI movies of a rapidly rotating test object (banana) were obtained at 5 ms resolution or 200 frames per second. In conclusion, 3D spatial phase-contrast MRI of 1D or 2D structures is respective four or two orders of magnitude faster than conventional 3D MRI.

BRIEF DESCRIPTION OF THE DRAWINGS

Further details and advantages of the invention are described in the following with reference to the attached drawings, which show in.

DESCRIPTION OF THE PREFERRED EMBODIMENTS

Figure 1:
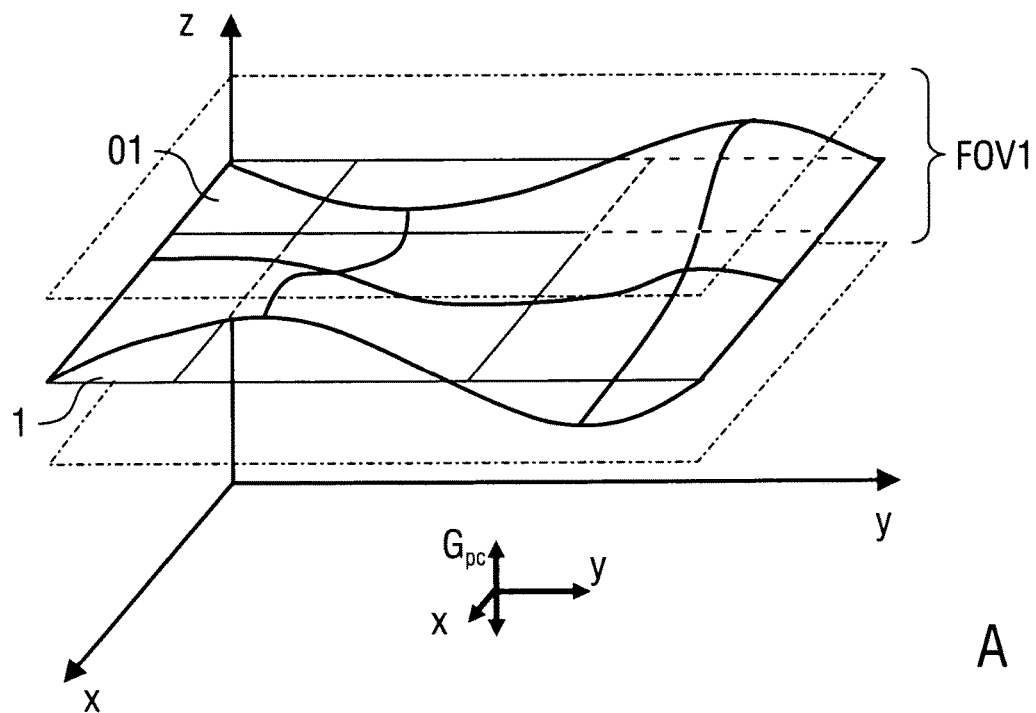
FIGS. 1 to 3: schematic illustrations of objects and sequence diagrams according to the first, second and third embodiments of the MR data collecting method according to the invention.
Figure 1:
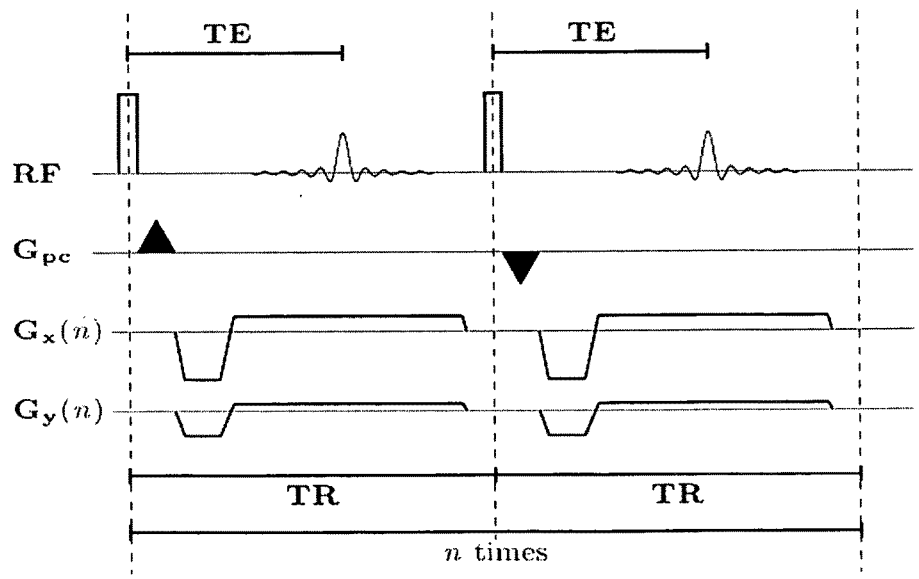

Preferred embodiments of the invention are described in the following with particular reference to the design of the phase-contrast gradients and examples of images obtained with the inventive technique. Details of an MRI device and the operation thereof, the construction of gradient-echo sequences and their adaptation to a particular object to be imaged, the numerical implementation of the mathematical formulation using available software tools, image reconstruction and optional further image processing steps are not described as far as they are known from conventional MRI techniques. Exemplary reference will be made in the following to objects located in a 3D space with a Cartesian coordinate system (x, y, z). The phase-contrast gradients are illustrated to be parallel to one of the x-, y- and/or z-axes. It is emphasized that this reference to the Cartesian coordinate axes is introduced for illustrative purposes only. In particular, the z-axis does not necessarily coincide with the direction of the static magnetic field in an MRI device. The direction of the phase-contrast gradients is selected in dependency on the object shape and object orientation in space. Although exemplary reference is made to objects having a layer, line or spot shape, the invention correspondingly can be applied with other objects, in particular having a finite extension along the direction of the phase-contrast gradient(s).

3D MRI of 2D Structures (First Embodiment of MR Data Collection)

According to the first embodiment of the invention, an object layer O1 is imaged as described in the following with reference to FIGS. 1A and 1B. The object layer O1 has a spin density distributed along a curved surface, which essentially extends parallel to the x-y-plane. Minimum extensions of the object layer O1 occur in the z-direction. Accordingly, the z-direction is selected as the predetermined spatial dimension for applying the phase-contrast gradients $G_{pc}$, and a plane parallel to the x-y-plane is selected as a projection plane 1. For MRI of the object layer O1, two 2D MR images representing projections of the object layer O1 onto the projection plane 1 in object space are collected with different settings of the spatially encoding phase-contrast gradients along the z-direction. The phase difference between MR signals acquired with the two different phase-contrast gradients represents the mean spin density position of the object layer O1 relative to the projection plane 1. The maximum extension of the field of view FOV1 parallel to the z-direction can be calculated on the basis of the relation $$2\pi = \gamma \times \text{gradient strength} \times \text{gradient duration} \times \text{FOV1}$$

with γ the gyromagnetic ratio of the used nucleus (e.g., protons) and for the theoretical case of a rectangular waveform for the spatially encoding phase-contrast gradient, so that the zero-order gradient moment may be calculated from the product of its strength and duration. In practice, this product is replaced by the time integral over the gradient waveform (which for velocity-encoding gradients always would be zero).

FIG. 1B shows the actual implementation of the RF pulse and magnetic field gradient sequence for mapping the object layer O1, wherein a radial FLASH MRI sequence is exploited as previously described in [5]. After subjecting the object layer O1 to a first non-selective RF excitation pulse, a first monopolar phase-contrast gradient $G_{pc}$ is applied, e.g. in positive z-direction. Subsequently, the object layer O1 is subjected to frequency-encoding gradients $G_x$ and $G_y$, and the MR signal, e.g. the illustrated gradient echo is acquired. This first repetition interval is immediately followed by a second repetition interval. Again after non-selective RF excitation, a second monopolar phase-contrast gradient $G_{pc}$ is applied, which is directed to the negative z-direction. A second MR signal is acquired with the same frequency-encoding gradients $G_x$ and $G_y$ as in the first repetition interval. The sequence of two repetition intervals with different phase-contrast gradients is repeated n times with different settings for the frequency-encoding gradients $G_x$ and $G_y$ until the data for two complete projection images of the object layer O1 onto the projection plane 1 are collected. For each pixel on the projection plane 1, the location of the object layer O1 in z-direction (i.e., the respective phase difference) and the associated intensity (relative amplitude) of the MR signal are obtained, so that a complete 3D image of the object layer O1 can be calculated.

If desired, the non-selective RF excitation may be replaced by a spatially selective or chemical shift-selective RF excitation. Moreover, in the version shown in FIG. 1B the (typically small) phase-contrast gradients are applied in an interleaved manner, that is in successive repetition intervals. However, also sequential acquisitions of complete images with different spatial phase-contrast gradients are possible. Such strategies may be advantageous for dynamic applications as they allow for a sliding window reconstruction of phase-difference maps at twice the frame rate. It should also be mentioned that, in contrast to conventional Fourier methods, the location of an object along the phase-difference dimension is accurately defined by a numerical value rather than affected by a discrete sampling pattern or contaminated by a point-spread function.

In order to dynamically visualize curved surface structures in 3D space at high speed, the radial encoding of the spatially-encoded phase-contrast images may be realized with pronounced undersampling. As a consequence, image reconstructions are accomplished with the use of a regularized nonlinear inversion algorithm as recently developed for improved parallel MRI [6] with radial encodings [7] at ultra-high temporal resolution [8,9]. Because these reconstructions are performed offline due to the high computational demand of the iterative algorithm, online monitoring of the magnitude images in real time is accomplished by gridding of more complete datasets which may be obtained by combining several (typically five) successively acquired datasets with complementary radial encodings as described in [5].

It should be noted that the use of the nonlinear inverse reconstruction algorithm for spatially encoded phase-contrast MRI successfully applies parallel imaging in 3D space by using only 2D coil sensitivity maps. The effective sensitivities are projections of the physical 3D coil sensitivities along the 2D structure onto the chosen imaging plane (projection plane 1). For a surface structure moving in 3D space this projection may rapidly change in time, which requires a continuous estimation of the coil sensitivities as ensured by the chosen nonlinear inverse algorithm [6-8]. To avoid phase errors due to varying coil sensitivities, each reconstructed image is first multiplied with its jointly estimated coil sensitivities to obtain a separate image for each channel. The background phase from off-resonance effects and coil sensitivities is removed when computing the respective phase differences. Finally, the phase-contrast maps from all channels are combined by weighting each pixel with its energy in the magnitude image of the respective channel.

2D/3D MRI of 1D Structures and Point Sources (Second Embodiment of MR Data Collection)

Figure 2:
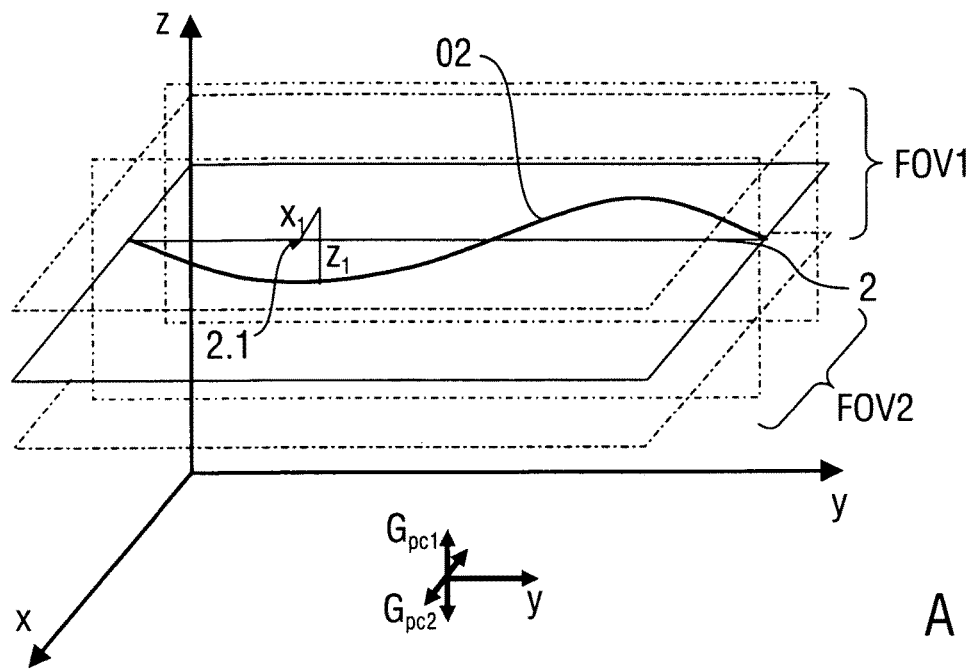
Figure 2:
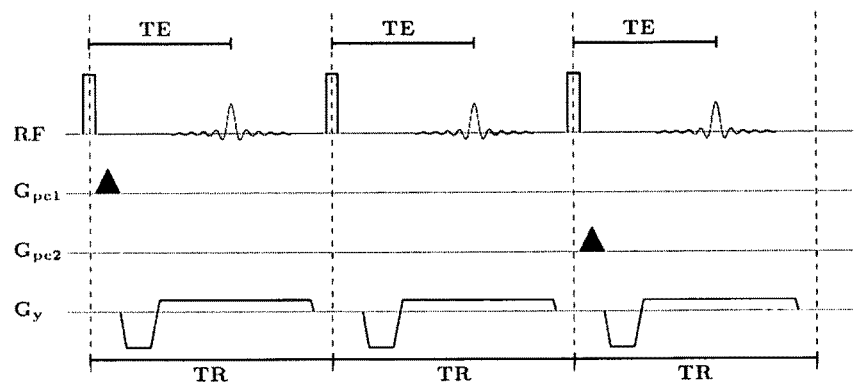
Figure 2:
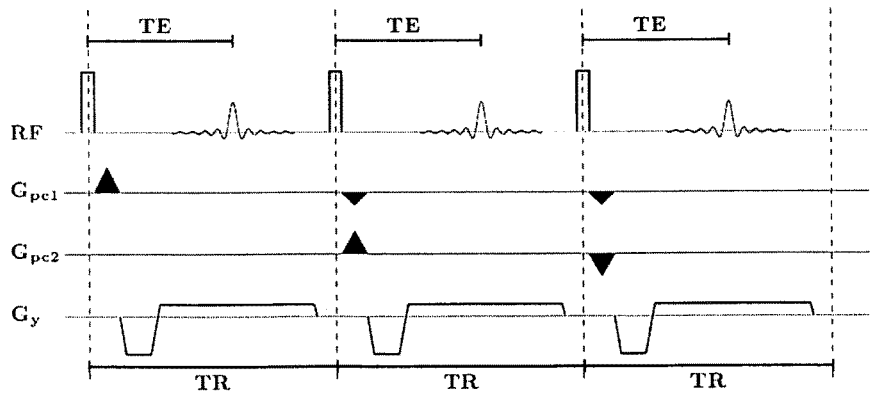

Additional variants of spatially encoded phase-contrast MRI refer to 2D and 3D mapping of 1D objects, i.e. linear structures, in even shorter measuring times that correspond to a total of only two or three repetition intervals, respectively. This is because the 2D experiment requires only two acquisitions of a single frequency-encoded MR signal with different phase-encoding gradients. Such data is sufficient to obtain a phase difference value for each frequency-encoded location: the resulting 2D map exhibits one frequency and one phase-difference dimension, while the reconstruction simply requires two 1D Fourier transformations and a single computation of the respective phase differences. Similarly, 3D mapping of a three-dimensionally curved 1D object with one frequency-encoded dimension and two spatial phase-difference dimensions may be accomplished within a measuring time of only three repetition intervals as illustrated in FIGS. 2A to 2C.

FIG. 2A illustrates the application of the inventive MR data collection method for 3D mapping of a three-dimensionally curved 1D object (object line O2). According to FIG. 2A, the object line O2 is a curved filament, which has a certain main axis parallel to the y-axis. This main axis is selected as a projection axis 2 along which a frequency-encoding gradient $G_y$ is applied. The selected spatial dimensions for applying the phase-contrast gradients $G_{pc1}$ and $G_{pc2}$ are oriented perpendicular to the projection axis 2, i.e. in the x- and z-directions. With the first phase-contrast gradient $G_{pc1}$, a first FOV1 along the z-direction is spanned, while with the second phase-contrast gradient $G_{pc2}$ a second FOV2 is spanned along the x-direction.

Figure 3:
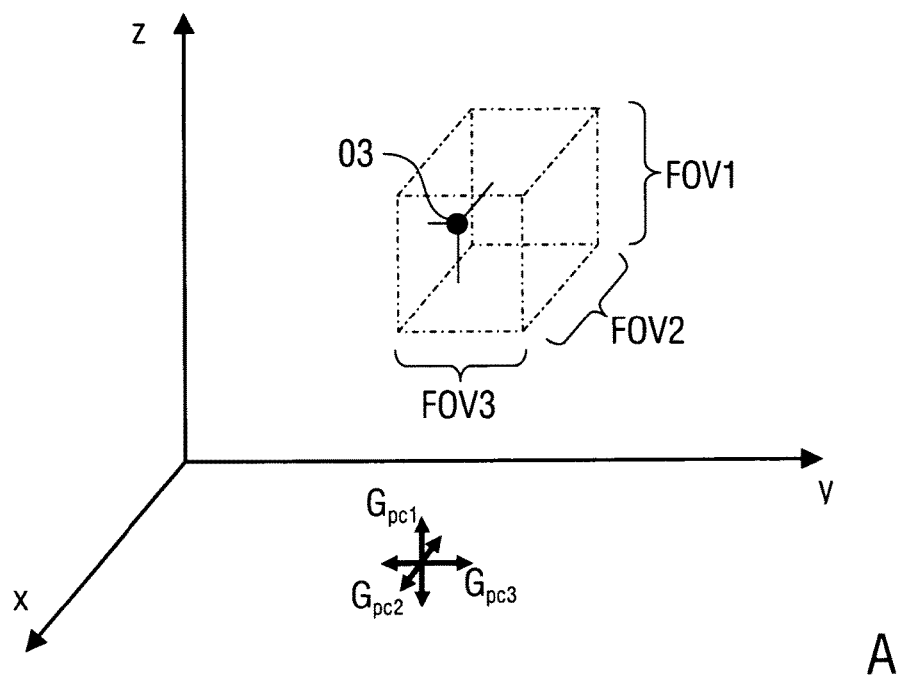
Figure 3:
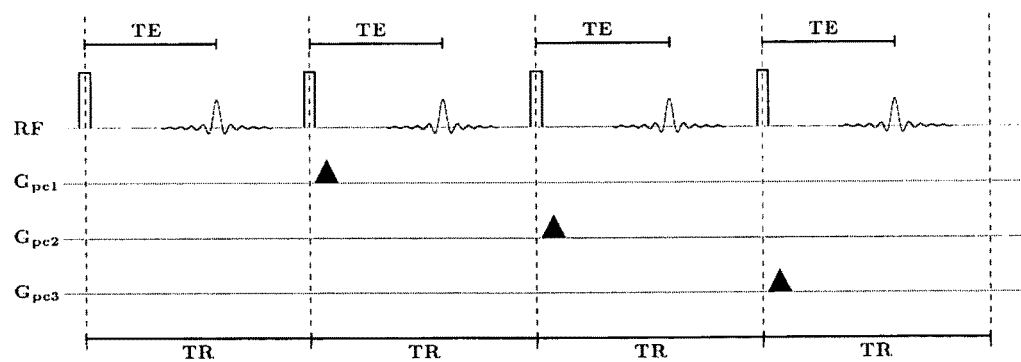

According to FIG. 2B, 3D imaging of the object line O2 requires three acquisitions of a single frequency-encoded MR signal, e.g. with two perpendicular monopolar phase-encoding gradients and one reference without spatial phase encoding. For each frequency-encoded location, two pairs of MR signals are obtained one of which being collected with one of the two phase-encoding gradients, respectively, and the other without spatial phase encoding. The phase differences between the signals of each pair yield the mean spin density positions in the respective direction, e. g. $z_1$ and $x_1$ in the z- and x-direction. Other combinations of spatial phase encodings are also possible as shown in FIG. 2C.

Information about the normal extension ("thickness") of the 1D object in spatial phase-contrast MRI is available from the amplitude information of the individual projections. Similar arguments hold true for 3D MRI of 2D objects and the amplitudes of the corresponding magnitude images. Although this information includes differences in relaxation-weighted proton density, it may be used to dynamically assign a voxel size to the 3D reconstruction that retains relative differences within the object.

2D/3D MRI of Point Sources (Third Embodiment of MR Data Collection)

According to the third embodiment of the invention, 3D mapping of a point source might be accomplished with four excitations and even shorter TR intervals. Without a frequency-encoding gradient respective 3D maps may be based on data collections from one repetition interval with an RF excitation pulse but no gradient at all and three repetition intervals with an RF excitation pulse and a spatially encoding phase-contrast gradient (e.g., in three perpendicular orientations). Each repetition interval comprises the acquisition of at least one complex data point. This is illustrated in FIGS. 3A and 3B. For obtaining the mean spin density position of the dot-shaped object (object spot O3), three phase-contrast gradients $G_{pc1}$, $G_{pc2}$ and $G_{pc3}$ are applied, which are directed along the z-, x- and y-directions, respectively. Accordingly, the 3D space is spanned by the perpendicular FOV1, FOV2 and FOV3. Three pairs of MR signals are obtained one of which being collected with one of the three phase-encoding gradients, respectively, and the other without spatial phase encoding. The phase differences between the signals of each pair yield the mean spin density positions in the respective x-, y- and z-direction.

MRI Device Including Control Device of the Invention

Figure 4:
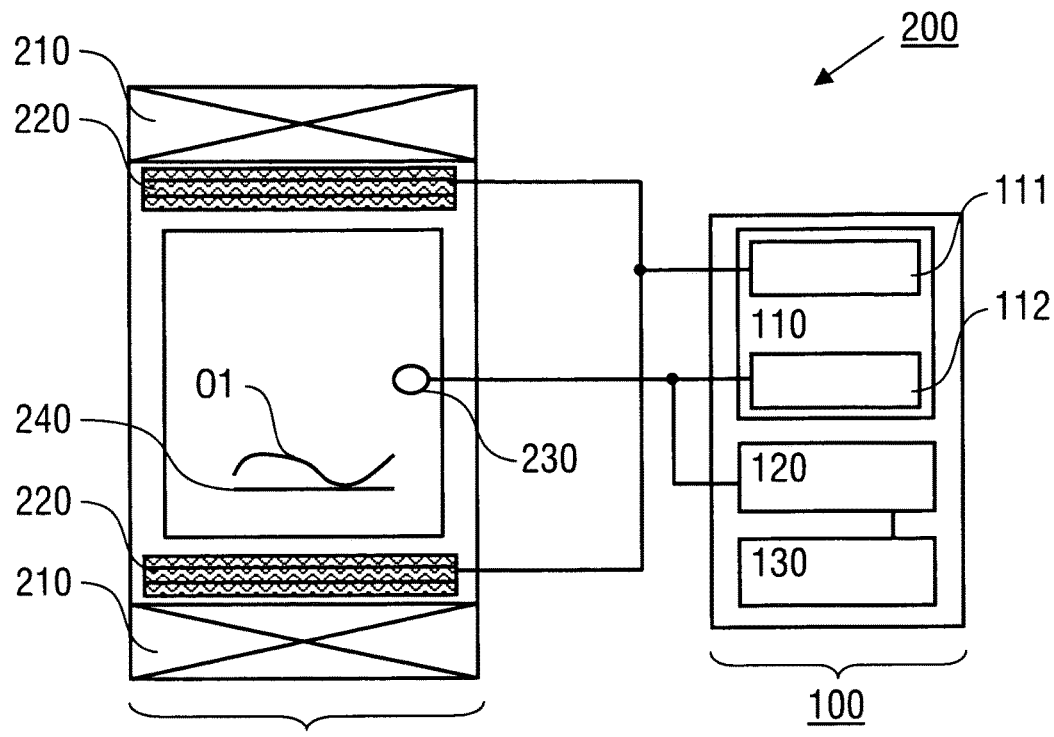
FIG. 4: a schematic illustration of a preferred embodiment of a control device and an MRI device according to the invention.

FIG. 4 schematically illustrates an embodiment of an MRI device 300 including an inventive control device 100 and an MR scanner 200. The control device 100 includes an RF pulse and gradient control device 110 with a phase-contrast gradient setting device 111 and an RF control unit 112, a signal acquisition device 120 and a calculation device 130. The MR scanner 200 includes a main magnetic field device 210, a magnetic gradient device 220 and an excitation/acquisition coil device 230. Furthermore, a holding device 240 is provided for supporting an object O1 to be investigated. The components 210 to 240 can be configured as it is known from conventional MR scanners. The phase-contrast gradient setting device 111 of the gradient control device 110 can be implemented by a circuit configured for setting the phase-contrast gradients or by a computer unit running a software which is adapted for controlling the setting of the magnetic gradient device 220.

The RF pulse and gradient control device 110 is connected with the excitation/acquisition coil device 230 and the magnetic gradient device 220 for creating the excitation RF pulses and the magnetic field gradients as described above. Furthermore, the excitation/acquisition coil device 230 is connected with the signal acquisition device 120 for sensing MR signals created in the object O1. The signal acquisition device 120 is connected with the calculation device 130, which is adapted for determining the at least one mean spin density position of the object or for reconstructing a complete image of the object with one of the methods outlined above.

Phantom and Human MRI Studies

Experimental verifications of the inventive methods were performed at a 3 Tesla static magnetic field with the use of a commercially available MR scanner (TIM Trio, Siemens Healthcare, Erlangen, Germany) and a standard 32-element head coil. As depicted in FIG. 1B, the preferred implementation of spatially encoding phase-contrast MRI employed a RF-spoiled radial FLASH sequence with a spatially non-selective RF excitation pulse and either an interleaved (every other repetition interval) or sequential scheme (every other image) for spatial phase encoding.

Figure 5:
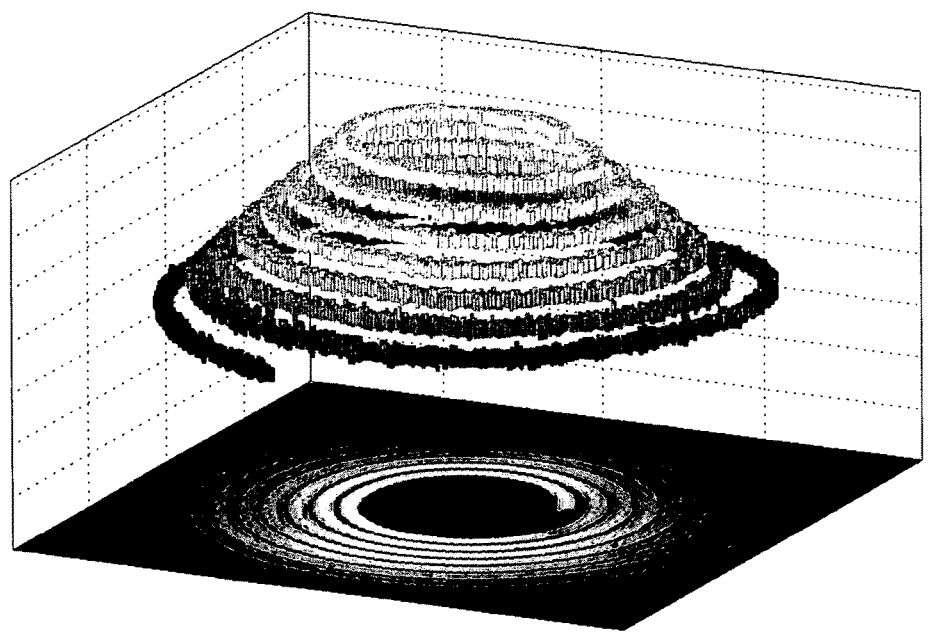
FIGS. 5 to 9: practical imaging results obtained with the invention.

Different phantoms of a tube filled with doped water (reduced T1 relaxation time) served to demonstrate the principles of spatially encoded phase-contrast MRI. Respective images were acquired using an interleaved encoding scheme with full k-space sampling and reconstructed by a conventional gridding algorithm comprising a density compensation, convolution with a Kaiser-Bessel kernel, interpolation to a regular grid, inverse fast Fourier transformation and roll-off correction compensating for the interpolation in k space (see [5]). FIG. 5 presents an example of a spatially encoded phase-contrast MR image of a water-filled tube arranged as a 3D spiral, which was obtained with the use of a fully sampled radial FLASH sequence and gridding reconstruction. The upper portion of FIG. 5 shows a 3D representation, while the lower portion shows a corresponding 2D phase-contrast map (magnitude image with an overlay of phase differences coded in grey levels). The images were obtained with a non-selective RF excitation pulse (flip angle 12°) at 1.0 mm linear resolution (repetition time TR=2.35 ms, echo time TE=1.61 ms).

Furthermore, three healthy subjects participated in studies of hand and finger movements that correspond to dynamic 3D MRI of a 2D structure. Human studies were performed with the use of a dual-echo radial FLASH MRI version as previously developed for cardiovascular real-time MRI (see [9]). Pertinent applications result in the simultaneous recording of two 2D phase-contrast maps under opposed-phase and in-phase conditions for water/fat signal contributions, respectively. Their complementary phase information was exploited to improve respective 3D representations (see below). The acquisition parameters for strongly undersampled radial FLASH images (TR=2.86 ms, TE1/TE2=1.25/2.25 ms, flip angle 3°, 2.0 mm in-plane resolution) achieved real-time 3D MRI movies with a minimum measuring time of 25 ms per image (9 spokes) or 50 ms per phase-difference map (i.e., 2×9 spokes). These applications employed a sequential acquisition strategy of two phase-encoded images with opposite polarity. The reconstruction of all undersampled images relied on regularized nonlinear inversion (see [6] to [8]).

Translation of the phase-contrast information into a spatial location and multi-dimensional visualization was accomplished using routines written in MATLAB (MathWorks, Natick, Mass.). Because the spatial phase information is given as a single numerical value, its 3D visualization as a voxel is realized by assigning the position an arbitrary though reasonable "thickness" which corresponds to the signal amplitude of the respective magnitude information. Together with the choice of a minimum intensity threshold, the procedure effectively eliminates noise contributions and maintains gross structural differences within the object under investigation.

Figure 6:
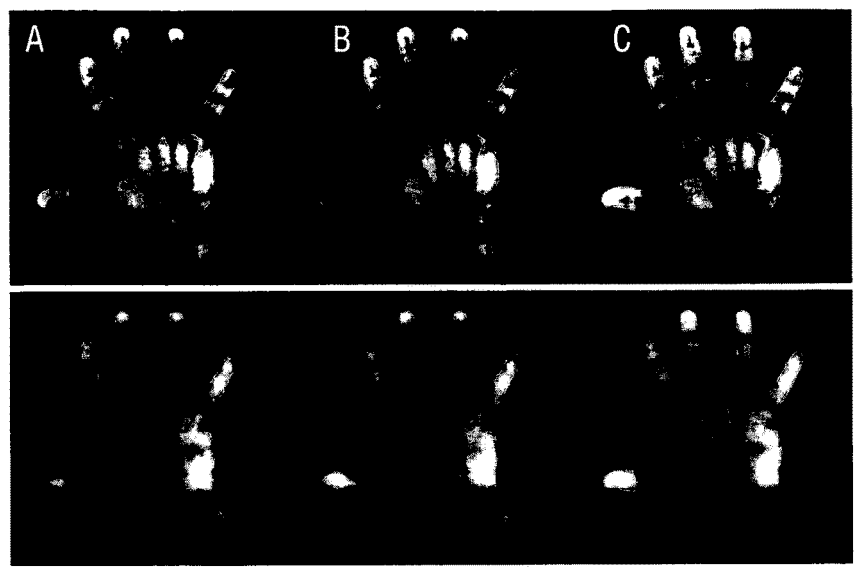

FIG. 6 presents the basic results of a spatially encoded phase-contrast MRI study of the human hand recorded with strongly undersampled dual-echo radial FLASH. The magnitude images with the phase overlay coded in grey values demonstrate that the phase information in the in vivo situation is dominated by magnetic field inhomogeneities and water/fat chemical shift differences in both opposed-phase and in-phase images (FIGS. 6A,B). These effects cancel in the corresponding phase-contrast maps (FIG. 6C), whereas phase differences due to the spatial encoding are retained. It also turns out that the opposed-phase situation may lead to regions of low intensities, for example due to bone marrow (FIG. 6, top), while the in-phase situation offers a more contiguous signal support for a reliable phase-contrast information in as many pixels as possible (FIG. 6, bottom). However, because both maps provide useful complementary information, the chosen visualization strategy took advantage of all information by combining the in-phase magnitude images with the phase values per pixel in both phase-contrast maps. The resulting map was then translated into a 3D representation.

Figure 7:
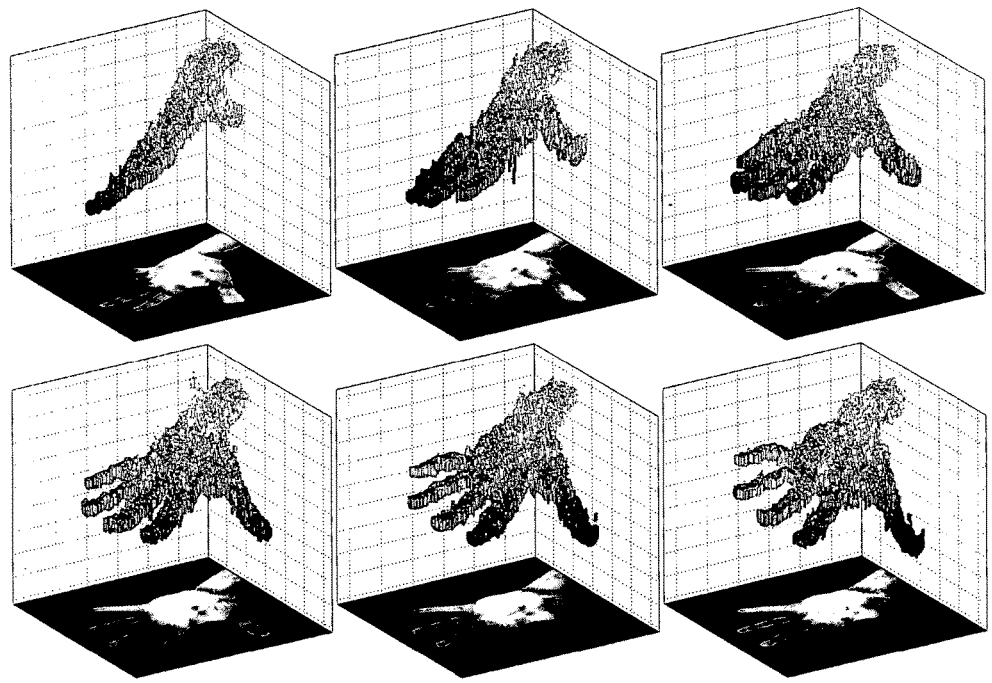

FIG. 7 shows consecutive 3D representations of a spatially encoded phase-contrast MRI movie (top) as well as the original 2D phase-contrast maps (bottom plane) of a moving human hand at a temporal resolution of 50 ms (same data and parameters as in FIG. 6). To enhance the visibility of the movement the images (top left to bottom right) depict only every 3rd frame (every 150 ms) covering a 800 ms period from a longer movie.

The experimental verification was then extended to dynamic 3D MRI of a 1D object (object line) at a temporal resolution of 5.0 ms. Because the latter experiment relies on only a single frequency-encoded MR signal (projection) with three different spatial phase encodings (see FIG. 2), respective 3D reconstructions require only 3 Fourier transformations and two corresponding phase-difference calculations. Pertinent computations are extremely fast and may immediately be implemented on existing MRI systems for real-time 3D visualization of dynamic linear objects.

Figure 8:
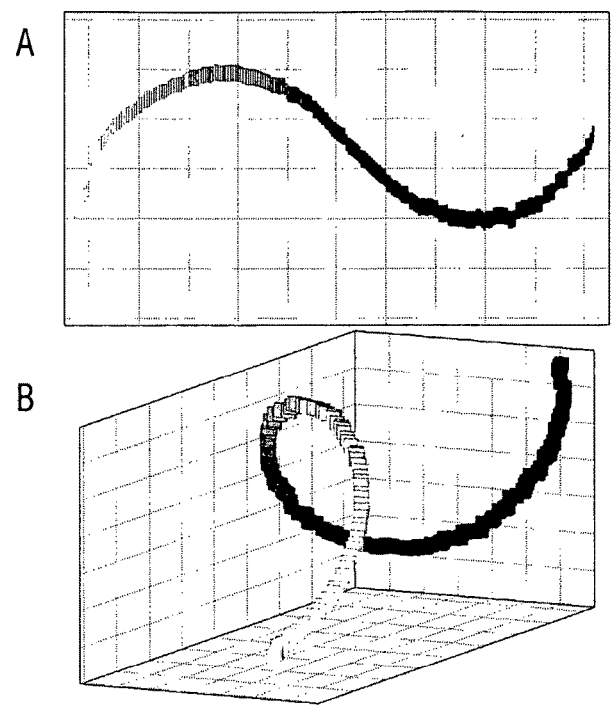

FIG. 8 shows two spatially encoded phase-contrast MR images of two differently curved water-filled tubes collected from only two or three acquisitions of a frequency-encoded gradient echo with non-selective RF excitation (flip angle 12°) at 1.0 mm linear resolution (TR/TE=2.00/1.32 ms). The 2D representation of a tube curved within a 2D plane shown in FIG. 8A is based on two acquisitions of a differently phase-encoded MR signal within a total measuring time of 4.0 ms. FIG. 8B shows the 3D representation of a tube curved within a 3D volume which is based on three acquisitions of a MR signal with two perpendicular phase-encoding gradients and without spatial phase encoding, respectively, within a total measuring time of 6.0 ms. Here, grey values serve to better visualize the spatial depth.

Figure 9:
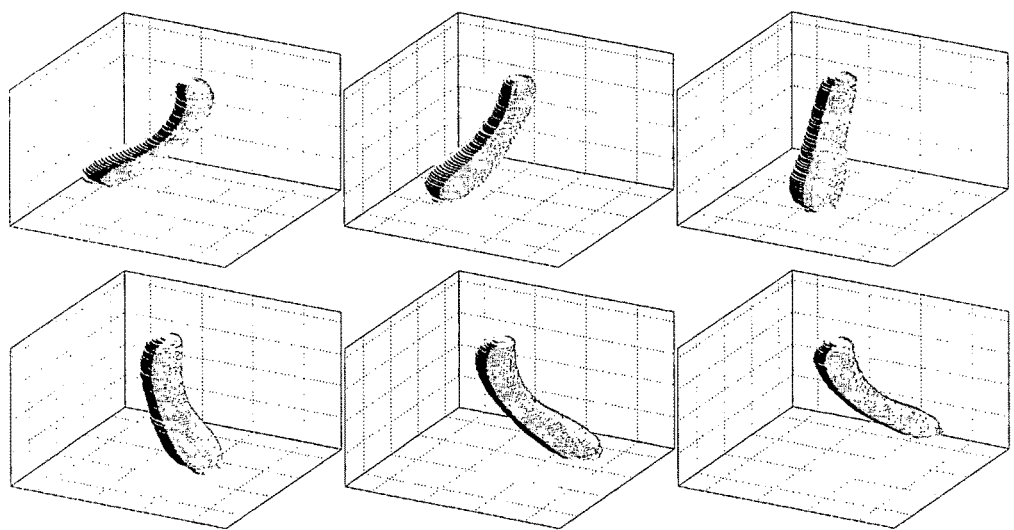

A dynamic study of a rapidly moving linear object is shown in FIG. 9 presenting selected views of a rotating banana after release from a twisted rubber band fixed at its top end. The data were collected with a non-selective RF excitation (flip angle 6°) at 2.0 mm linear resolution (TR/TE=1.68/1.15 ms). The corresponding 3D MRI movie achieved a temporal resolution of 5.0 ms, that is 200 frames per second. The images (top left to bottom right) depict every 20th frame (every 100 ms) covering a 505 ms period from a longer movie.

The features of the invention disclosed in the above description, the figures and the claims can be equally significant for realising the invention in its different embodiments, either individually or in combination.

The invention claimed is:

1. A method of collecting magnetic resonance data for three-dimensional imaging of an object with a spin density distributed along an object layer, said object being arranged in an object space in a static magnetic field, comprising the following steps:
   (a) subjecting said object to at least one spatially non-selective radiofrequency pulse and magnetic field gradients for creating spatially encoded magnetic resonance signals, including at least two settings of spatially encoding phase-contrast gradients differently encoding a phase of said magnetic resonance signals in at least one field of view in a predetermined spatial dimension,
   (b) acquiring at least two magnetic resonance signals, each with one of said at least two settings of different spatially encoding phase-contrast gradients, wherein two two-dimensional magnetic resonance images are acquired which represent projections of the object onto a projection plane in the object space with said at least two settings of different spatially encoding phase-contrast gradients along a spatial dimension perpendicular to said projection plane, and
   (c) determining at least one mean spin density position of said object along said spatial dimension by calculating a phase difference between said two two-dimensional magnetic resonance images and determining a three-dimensional image of said object.

2. The method according to claim 1, wherein said at least two settings of different spatially encoding phase-contrast gradients along said field of view in said predetermined spatial dimension comprise:

settings of a zero gradient having a strength G=0 and a monopolar gradient having a strength G>0, or
settings of two monopolar gradients having a strength G>0 and opposite polarity, or
settings of two monopolar gradients having strengths $G_1$>0, $G_2$>0 and $G_1 \neq G_2$, or
settings of a zero gradient having a strength G=0 and an asymmetric bipolar gradient having a zero-order gradient moment>0 for spatially encoding stationary spins and a first-order gradient moment=0 for spins moving with constant velocity.

3. The method according to claim 1, wherein said different spatially encoding phase-contrast gradients are consecutively set
   in immediately successive repetitions of said at least one radiofrequency pulse and magnetic field gradients, or
   in successive image acquisitions with said at least one radiofrequency pulse and magnetic field gradients.

4. The method according to claim 1, wherein
said at least one radiofrequency pulse and magnetic field gradients are adapted for Cartesian frequency- and phase-encoding, radial encoding, spiral encoding or other non-Cartesian encoding.

5. The method according to claim 1, wherein
said at least one radiofrequency pulse and magnetic field gradients comprise a low-flip angle gradient-echo MRI sequence, a spin-echo MRI sequence, a stimulated echo MRI sequence, or an echo-planar imaging sequence.

6. The method according to claim 5, wherein
the low-flip angle gradient-echo MRI (FLASH) sequence comprises an undersampled radial FLASH sequence.

7. The method according to claim 1, wherein
said steps (a) to (c) are repeated at a repetition rate in such a way as to allow for dynamic imaging of said object with temporal resolution.

8. A method of collecting magnetic resonance data for three-dimensional imaging of an object with a spin density being distributed along an object line or being concentrated in an object spot having a predetermined, extension, said object being arranged in an object space in a static magnetic field, comprising the following steps:
   (a) subjecting said object to at least one spatially non-selective radiofrequency pulse and magnetic field gradients, said magnetic field gradients including a frequency-encoding gradient oriented along a projection axis in the object space, for creating spatially encoded magnetic resonance signals, including at least three different settings of spatially encoding phase-contrast gradients differently encoding a phase of said magnetic resonance signals along two fields of view in two predetermined spatial dimensions perpendicular to a direction of said frequency-encoding gradient,
   (b) acquiring at least three frequency-encoded magnetic resonance signals representing three projections of the object onto said projection axis, each after application of one of said different settings of spatially encoding phase-contrast gradients, and
   (c) determining at least one mean spin density position of said object along said spatial dimension by calculating a phase difference between said projections and determining a three-dimensional image of said object.

9. A computer program residing on a non-transitory computer-readable medium, with a program code for carrying out the method according to claim 1.

10. The method according to claim 8, wherein
said steps (a) to (c) are repeated at a repetition rate in such a way as to allow for dynamic imaging of said object with temporal resolution.

11. The method according to claim 8, wherein said settings of at least three different spatially encoding phase-contrast gradients comprise
setting of one zero gradient having a strength G=0, and
settings of two gradients having strengths G>0 and being created along said two fields of view in said two predetermined spatial dimensions.

12. The method according to claim 8, wherein said different spatially encoding phase-contrast gradients are consecutively set
in immediately successive repetitions of said at least one radiofrequency pulse and magnetic field gradients, or
in successive image acquisitions with said at least one radiofrequency pulse and magnetic field gradients.

13. The method according to claim 8, wherein
said at least one radiofrequency pulse and magnetic field gradients are adapted for Cartesian frequency- and phase-encoding, radial encoding, spiral encoding or other non-Cartesian encoding.

14. The method according to claim 8, wherein
said at least one radiofrequency pulse and magnetic field gradients comprise a low-flip angle gradient-echo MRI sequence, a spin-echo MRI sequence, a stimulated echo MRI sequence, or an echo-planar imaging sequence.

15. The method according to claim 14, wherein
the low-flip angle gradient-echo MRI (FLASH) sequence comprises an undersampled radial FLASH sequence.

16. A control device being adapted for collecting magnetic resonance data for three-dimensional imaging of an object with a spin density being distributed along an object layer, said object being arranged in an object space in a static magnetic field, comprising:
a pulse and gradient control device being adapted for subjecting said object to at least one spatially non-selective radiofrequency pulse and magnetic field gradients for creating spatially encoded magnetic resonance signals, including a phase-contrast gradient setting device being adapted for at least two settings of spatially encoding phase-contrast gradients differently encoding a phase of said magnetic resonance signals in at least one field of view in a predetermined spatial dimension,
a signal acquisition device being adapted for acquiring at least two magnetic resonance signals, each with one of said at least two settings of different spatially encoding phase-contrast gradients, wherein said signal acquisition device is adapted for acquiring two two-dimensional magnetic resonance images representing projections of the object onto a projection plane in the object space with said different settings of spatially encoding phase-contrast gradients along a spatial dimension perpendicular to said projection plane, and
a calculation device being adapted for determining at least one mean spin density position of said object along said spatial dimension by calculating a phase difference between said two two-dimensional magnetic resonance images and for determining a three-dimensional image of said object.

17. The control device according to claim 16, wherein said phase-contrast gradient setting device is adapted for
settings of a zero gradient having a strength G=0 and a monopolar gradient having a strength G>0, or
settings of two monopolar gradients having a strength G>0 and opposite polarity, or
settings of two monopolar gradients having strengths $G_1>0$, $G_2>0$ and $G_1 \neq G_2$, or
settings of a zero gradient having a strength G=0 and an asymmetric bipolar gradient having a zero-order gradient moment>0 for spatially encoding stationary spins and a first-order gradient moment=0 for spins moving with constant velocity.

18. The control device according to claim 16, wherein said pulse and gradient control device is adapted for consecutively setting different spatially encoding phase-contrast gradients
in immediately successive repetitions of said radiofrequency pulses and magnetic field gradients, or
in successive image acquisitions with said radiofrequency pulses and magnetic field gradients.

19. The control device according to claim 16, wherein
said pulse and gradient control device is adapted for Cartesian frequency- and phase-encoding, radial encoding, spiral encoding or other non-Cartesian encoding.

20. The control device according to claim 16, wherein
said pulse and gradient control device is adapted for creating a low-flip angle gradient-echo MRI sequence, a spin-echo MRI sequence, a stimulated echo MRI sequence, or an echo-planar imaging sequence.

21. The control device according to claim 20, wherein
the low-flip angle gradient-echo MRI (FLASH) sequence comprises an undersampled radial FLASH sequence.

22. The control device according to claim 16, wherein
said pulse and gradient control device and said signal acquisition device being adapted for repeated operation at a repetition rate in such a way as to allow for dynamic imaging of said object with temporal resolution.

23. A magnetic resonance imaging (MRI) device, including
a magnetic resonance scanner, and
the control device according to claim 16, coupled with the magnetic resonance scanner.

24. A control device being adapted for collecting magnetic resonance data for three-dimensional imaging of an object with a spin density being distributed along an object line or being concentrated in an object spot having a predetermined extension, said object being arranged in an object space in a static magnetic field, comprising:
a pulse and gradient control device being adapted for subjecting said object to at least one spatially non-selective radiofrequency pulse and magnetic field gradients, including a frequency-encoding gradient oriented along a projection axis in the object space, for creating spatially encoded magnetic resonance signals, including a phase-contrast gradient setting device being adapted for at least three different settings of spatially encoding phase-contrast gradients differently encoding a phase of said magnetic resonance signals along two fields of view in two predetermined spatial dimensions perpendicular to a direction of said frequency-encoding gradient,
a signal acquisition device being adapted for acquiring at least three frequency-encoded magnetic resonance signals representing three projections of the object onto said projection axis, each after application of one of said different settings of spatially encoding phase-contrast gradients, and a calculation device being adapted for determining at least one mean spin density position of said object along said spatial dimension by calculating a phase difference between said projections and for determining a three-dimensional image of said object.

25. The control device according to claim 24, wherein said phase-contrast gradient setting device is adapted for
setting of one zero gradient having a strength G=0, and
settings of two gradients having strengths G>0 and being created along said two fields of view in said two predetermined spatial dimensions.

26. The control device according to claim 24, wherein
said pulse and gradient control device and said signal acquisition device being adapted for repeated operation at a repetition rate in such a way as to allow for dynamic imaging of said object with temporal resolution.

27. A magnetic resonance imaging (MRI) device, including
a magnetic resonance scanner, and
the control device according to claim 24, coupled with the magnetic resonance scanner.

28. The control device according to claim 24, wherein said pulse and gradient control device is adapted for consecutively setting different spatially encoding phase-contrast gradients
in immediately successive repetitions of said radiofrequency pulses and magnetic field gradients, or
in successive image acquisitions with said radiofrequency pulses and magnetic field gradients.

29. The control device according to claim 24, wherein
said pulse and gradient control device is adapted for Cartesian frequency- and phase-encoding, radial encoding, spiral encoding or other non-Cartesian encoding.

30. The control device according to claim 24, wherein
said pulse and gradient control device is adapted for creating a low-flip angle gradient-echo MRI sequence, a spin-echo MRI sequence, a stimulated echo MRI sequence, or an echo-planar imaging sequence.

31. The control device according to claim 30, wherein
the low-flip angle gradient-echo MRI (FLASH) sequence comprises an undersampled radial FLASH sequence.

* * * * *